(12) United States Patent
Wada et al.

(10) Patent No.: US 7,183,853 B2
(45) Date of Patent: Feb. 27, 2007

(54) FEEDBACK AMPLIFIER HAVING AMPLIFIED SIGNAL PATH AND FEEDBACK SIGNAL PATH SEPARATED

(75) Inventors: Shigeki Wada, Minato-ku (JP); Yasuhiro Watanabe, Kawasaki (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 74 days.

(21) Appl. No.: 10/516,102

(22) PCT Filed: May 30, 2003

(86) PCT No.: PCT/JP03/06800

§ 371 (c)(1),
(2), (4) Date: Nov. 30, 2004

(87) PCT Pub. No.: WO03/103139

PCT Pub. Date: Dec. 11, 2003

(65) Prior Publication Data

US 2005/0253653 A1    Nov. 17, 2005

(30) Foreign Application Priority Data

May 30, 2002   (JP) .............................. 2002-158146

(51) Int. Cl.
*H03F 3/45* (2006.01)
*H03F 3/16* (2006.01)

(52) U.S. Cl. ...................... 330/260; 330/277; 330/294; 330/311

(58) Field of Classification Search ..................... None
See application file for complete search history.

(56) References Cited

U.S. PATENT DOCUMENTS

| 5,025,226 | A  | * | 6/1991  | Taylor ........................ 330/277 |
| 5,030,925 | A  |   | 7/1991  | Taylor                                 |
| 5,343,160 | A  |   | 8/1994  | Taylor                                 |
| 5,821,812 | A  |   | 10/1998 | Park et al.                            |
| 6,114,686 | A  |   | 9/2000  | Funahashi                              |
| 6,600,371 | B2 | * | 7/2003  | Cali ........................... 330/260 |
| 6,750,712 | B1 | * | 6/2004  | Hoang ........................ 330/260  |

FOREIGN PATENT DOCUMENTS

JP    H02-199934 A    8/1990

(Continued)

*Primary Examiner*—Khanh Van Nguyen
(74) *Attorney, Agent, or Firm*—Sughrue Mion, PLLC

(57) ABSTRACT

A separation circuit part is used to separate an amplified signal path from a feedback signal path. An amplifier circuit part comprises a resistor-loaded common-source FET, a level adjustment diode and a source-follower circuit. The separation circuit part comprises a source-follower circuit, an output part of which is connected to a feedback circuit part comprising a resistor, thereby forming a feedback signal path to an input terminal of the amplifier circuit part. The signal separation circuit is used to separate the amplified signal path from the feedback signal path, thereby reducing the loads of the signal paths. In this way, the loads of the amplified signal and feedback signal paths are reduced. The delay time to be added in the separation circuit part is adjusted to cause the frequency range where the feedback changes from a negative feedback to a positive feedback to be coincident with the frequency range where the gain of the negative feedback amplifier part decreases, thereby realizing a wide band of gain.

11 Claims, 10 Drawing Sheets

FOREIGN PATENT DOCUMENTS

| | | |
|---|---|---|
| JP | H03-250803 A | 11/1991 |
| JP | 9-153745 | 6/1997 |
| JP | H09-246878 A | 9/1997 |
| JP | 10-79625 | 3/1998 |
| JP | 10-117124 A | 5/1998 |
| JP | 2001-217657 A | 8/2001 |

* cited by examiner

FEEDBACK AMPLIFIER HAVING AMPLIFIED SIGNAL PATH AND FEEDBACK SIGNAL PATH SEPARATED

TECHNICAL FIELD

The present invention relates to a feedback amplifier, and more particularly to a feedback amplifier, such as a current-feedback amplifier or the like, for converting a current signal output from a photodiode or the like into a voltage signal and amplifying the voltage signal.

BACKGROUND ART

Heretofore, feedback amplifiers are used as amplifiers for amplifying an input signal on feedback principles. The feedback amplifier is a circuit for amplifying an input signal while returning a portion of the input signal to the input terminal to superpose the returned signal on the original input signal, thus improving electric characteristics of the amplifier. A conventional current-feedback amplifier (preamplifier) for use in optical communication systems which have been developed rapidly with the advancement of the information communication technology in recent years will be described in detail below.

In a receiver used in an optical communication system, an optical signal received through an optical fiber is converted into a weak current signal by a photodiode or the like which serves as a photoelectric transducer. The current signal is converted into a voltage signal, which is amplified by a preamplifier. The preamplifier is required to have such characteristics as high sensitivity, a high gain, a wide band, and a wide dynamic range. To meet such a requirement, it has conventionally been the most general practice to use a current-feedback amplifier referred to as a transimpedance preamplifier.

FIG. 1 of the accompanying drawings shows, as the conventional feedback amplifier, a transimpedance amplifier using a field-effect transistor (FET). As shown in FIG. 1, input current 405 from a photoelectric transducer is input to an input terminal, and impedance-converted by a preamplifier into a voltage signal which is amplified through amplified signal path 403. Input current 405 that is input to the transimpedance amplifier and the output voltage from amplifying circuitry 410 of the transimpedance amplifier are related to each other in proportion to the product of the resistance of feedback resistor 401 and input current 405. According to the conventional arrangement, the resistance of feedback resistor 401 of the preamplifier is of a large value to provide a high gain for making the preamplifier highly sensitive to the weak input signal.

However, since there is a trade-off existing between the gain and the band of the conventional circuit, if the resistance of the feedback resistor is increased to achieve a high sensitivity, i.e., a high gain, then the band tends to be reduced. Another problem of the increased resistance of the feedback resistor is that a voltage amplitude due to an input current flowing through the feedback resistor increases, saturating the output amplitude, which is liable to distort the output waveform and cause an operation failure.

DISCLOSURE OF THE INVENTION

The present invention has been made in view of the above problems. It is an object of the present invention to provide a feedback amplifier having such characteristics as high sensitivity, a high gain, a wide band, and a wide dynamic range.

To achieve the above object, a feedback amplifier according to a first invention includes an amplifying circuitry, a feedback circuitry, a signal separating circuitry, and an output circuitry in order to solve the above problems. The amplifying circuitry includes a transistor and a resistive element for amplifying an input signal and a level adjusting circuit for connecting an amplified signal to a next circuitry. An output signal from the level adjusting circuit of the amplifying circuitry is connected to the output circuitry and the signal separating circuitry in a next stage. The signal separating circuitry has an output connected to the feedback circuitry, and the output of the feedback circuitry is input to the transistor of the amplifying circuit.

To solve the above problems, a feedback amplifier according to a second invention includes an amplifying circuitry, a feedback circuitry, a signal separating circuitry, and an output circuitry. The amplifying circuitry includes a transistor and a resistive element for amplifying an input signal and a level adjusting circuit for connecting an amplified signal to a next circuitry. An output signal from the level adjusting circuit of the amplifying circuitry is connected to the output circuitry and the signal separating circuitry in a next stage. The signal separating circuitry has an output connected to the feedback circuitry, and the output of the feedback circuitry is input to the transistor of the amplifying circuit. The feedback amplifier thus arranged serves as a current-feedback amplifier.

To solve the above problems, a feedback amplifier according to a third invention includes an amplifying circuitry, a feedback circuitry, a signal separating circuitry, and an output circuitry. The amplifying circuitry includes a transistor and a resistive element for amplifying an input signal and a level adjusting circuit for connecting an amplified signal to a next circuitry. An output signal from the level adjusting circuit of the amplifying circuitry is connected to the output circuitry in a next stage and also the signal separating circuitry which is of a multistage arrangement having a level shifting circuit or a transistor, a resistive element, and a level shifting circuit. The signal separating circuit has at least two signal outputs connected to the feedback circuitry, and at least two of the feedback circuitry have signal outputs input to the transistor of the amplifying circuitry.

To solve the above problems, a feedback amplifier according to a fourth invention includes an amplifying circuitry, a feedback circuitry, a signal separating circuitry, and an output circuitry. The amplifying circuitry includes a transistor and a resistive element for amplifying an input signal and a level adjusting circuit for connecting an amplified signal to a next circuitry. An output signal from the level adjusting circuit of the amplifying circuitry is connected to the output circuitry in a next stage and also the signal separating circuitry which is of a multistage arrangement having a level shifting circuit or a transistor, a resistive element, and a level shifting circuit. The signal separating circuit has at least two signal outputs connected to the feedback circuitry which includes at least one diode, and the feedback circuitry have an output input to the transistor of the amplifying circuitry.

To solve the above problems, a feedback amplifier according to a fifth invention is of a circuit arrangement in which the signal separating circuitry according to the first through fourth inventions comprises at least one level shifting circuit.

To solve the above problems, a feedback amplifier according to a sixth invention is of a circuit arrangement in which the signal separating circuitry according to the first through fifth inventions has a control terminal for controlling a feedback signal.

As is apparent from the above description, with the feedback amplifier according to the present invention, since the amplified signal path and the feedback signal path are separated from each other by the separating circuitry, the loads imposed respectively on the amplified signal path and the feedback signal path are smaller than those in the conventional circuit for achieving wide-band characteristics.

A delay time added by the separating circuitry is adjusted to match a frequency range, in which negative feedback changes to positive feedback, to a frequency range in which the gain of a negative feedback amplifying section is lowered, thereby further achieving a wider band for the gain. Because a voltage variation (the product of a feedback resistor and an input current) due to an input current is separated from the amplified signal path, a distortion of the output waveform and an operation failure due to a high current input are reduced for a wider dynamic range. The feedback circuitry including the diode is capable of automatically switching a feedback quantity depending on the input current, thus realizing a wider dynamic range.

The control terminal of the separating circuitry is capable of adjusting amplifier characteristics depending on the characteristics of photodetector elements, providing a receiver circuit having uniform output characteristics.

BEST MODE FOR CARRYING OUT THE INVENTION

Feedback amplifiers according to embodiments of the present invention will be described below with reference to the accompanying drawings. FIGS. 2 through 12 show feedback amplifiers according to embodiments of the present invention. Circuits of feedback amplifiers according to the present invention which use a field-effect transistor (FET) therein will be described in detail below with reference to the drawings.

(1st Embodiment)

Figure 2:
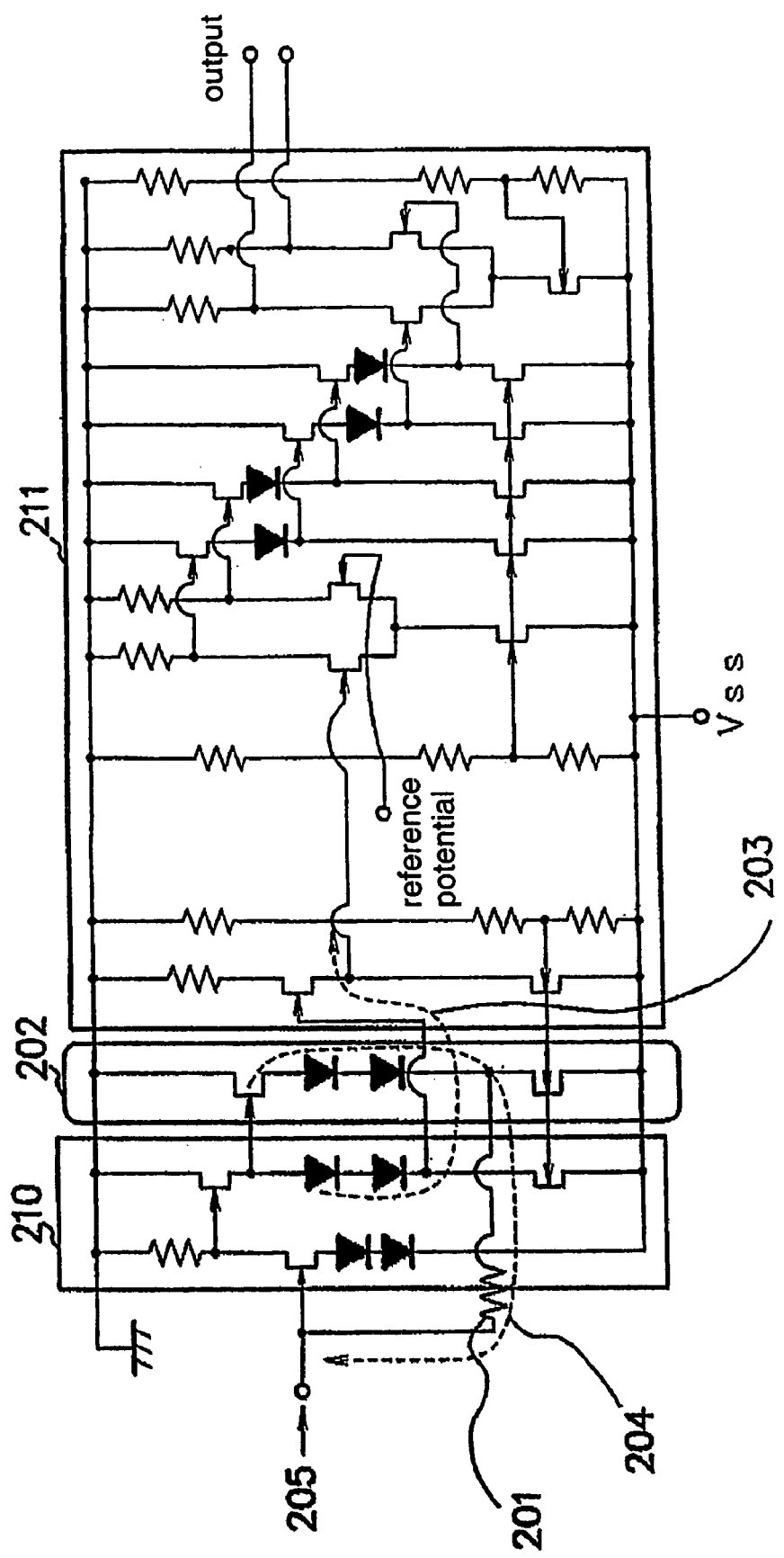
FIG. 2 is a circuit diagram of a circuit according to a first embodiment of the present invention.

FIG. 2 is a circuit diagram of a circuit according to a first embodiment of the present invention, of feedback amplifiers according to first, second, and fifth inventions. The feedback amplifier shown in FIG. 2 comprises amplifying circuitry 210 for amplifying input current 205, separating circuitry 202 and output circuitry 211 which are connected to the output of amplifying circuitry 210, and feedback circuitry 201 which is connected to the output of separating circuitry 202 and an input terminal. The feedback amplifier shown in FIG. 2 is characterized in that amplified signal path 203 and feedback signal path 204 are separated from each other by separating circuitry 202. Amplifying circuitry 210 according to the present embodiment comprises a source-grounded FET under a resistive load, a level-adjusting diode, and a source follower circuit. Separating circuitry 202 comprises a source follower circuit and has an output connected to feedback circuitry 201 in the form of a resistor. Feedback circuitry 201 is connected to the input terminal of amplifying circuitry 210 through feedback signal path 204.

According to the present embodiment, amplified signal path 203 and feedback signal path 204 are separated from each other by separating circuitry 202. Therefore, the loads imposed respectively on amplified signal path 203 and feedback signal path 204 are smaller than those in the conventional circuit shown in FIG. 1 for achieving wide-band characteristics. A delay time added by separating circuitry 202 is adjusted to match a frequency range, in which negative feedback changes to positive feedback, to a frequency range in which the gain of a negative feedback amplifying section is lowered, thereby further achieving a wider band for the gain.

Figure 3:
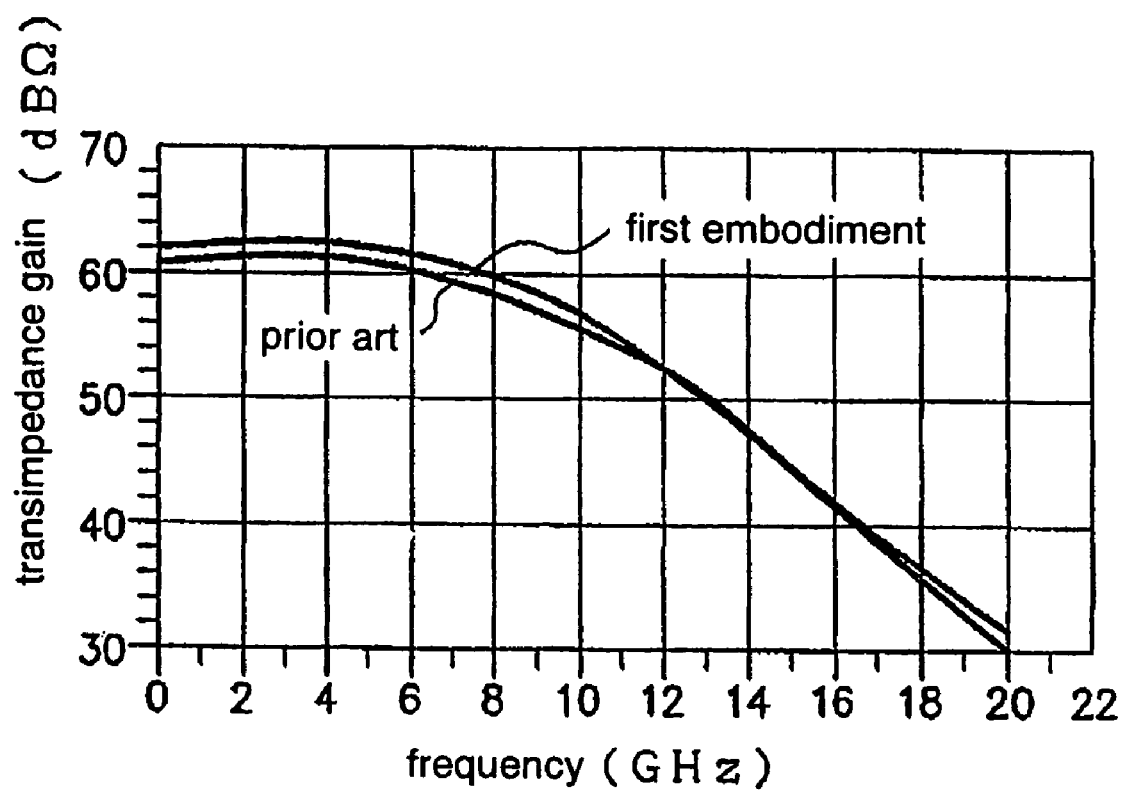
FIG. 3 is a diagram showing the frequency characteristics of gains of the circuit according to the first embodiment and the conventional circuit.

A voltage variation (the product of feedback resistor 201 and input current 205) due to input current 205 is separated from amplified signal path 203. Consequently, a distortion of the output waveform and an operation failure due to a high current input are reduced for a wider dynamic range. FIG. 3 shows, for comparison, the frequency characteristics of gains of the circuit according to the present embodiment and the conventional circuit shown in FIG. 1, with input capacitance 250 fF and input resistance 20 Ω added as a photodiode model to those circuits. Both the gain and band of the circuit according to the present invention are improved over those of the conventional circuit. With regard to the dynamic range, a maximum allowable input current applied to the circuit according to the present invention is 5% or more greater than that applied to the conventional circuit.

With the above arrangement, the first embodiment can achieve higher sensitivity, a higher gain, a wider band, and a wider dynamic range than the conventional circuit.

(2nd Embodiment)

Figure 4:
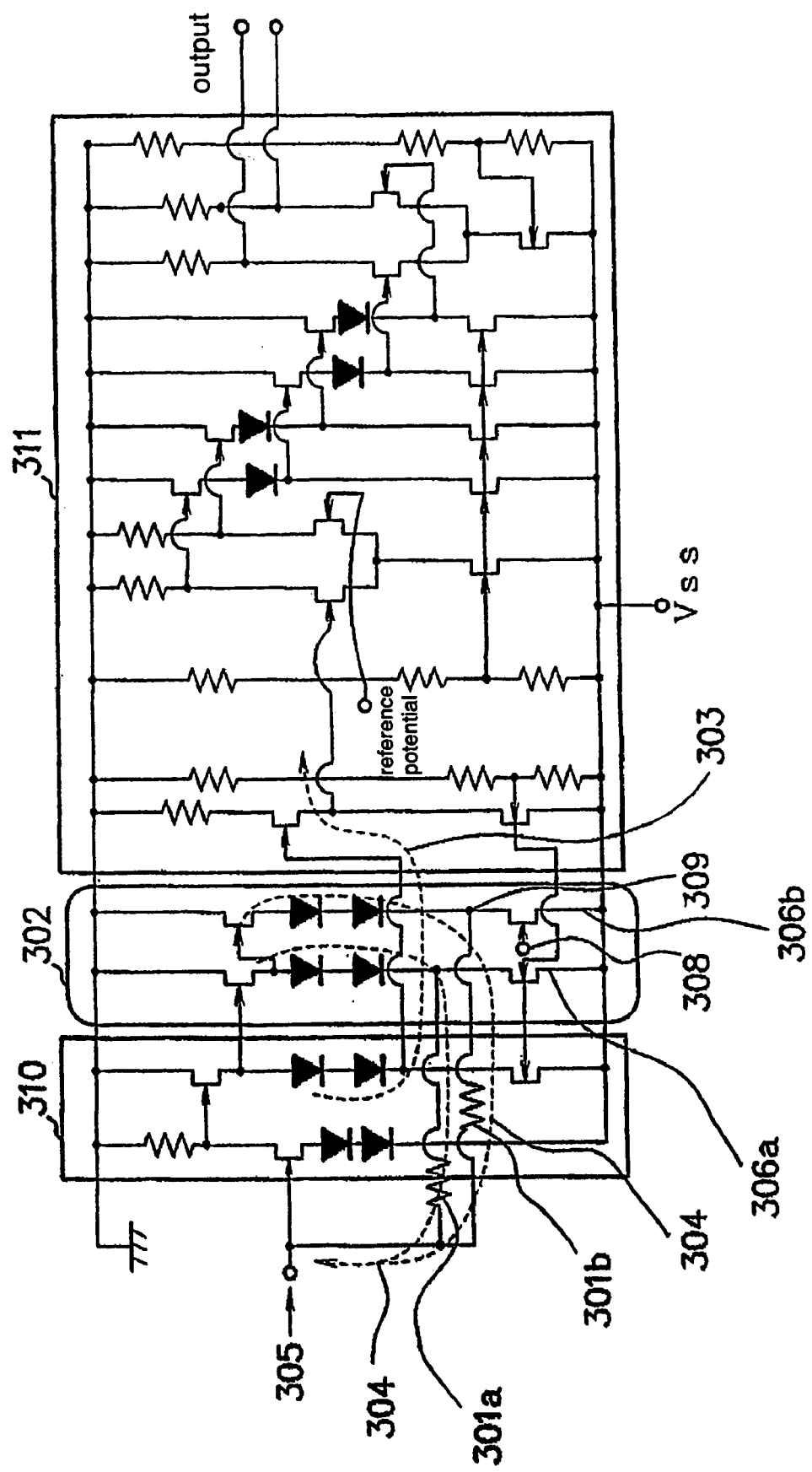
FIG. 4 is a circuit diagram of a circuit according to a second embodiment of the present invention.

FIG. 4 is a circuit diagram of a circuit according to a second embodiment of the present invention, of feedback amplifiers according to first through third, fifth, and sixth inventions. The feedback amplifier shown in FIG. 4 comprises amplifying circuitry 310 for amplifying input current 305, separating circuitry 302 and output circuitry 311 which are connected to the output of amplifying circuitry 310, and feedback circuitries 301a, 301b which are connected both to the outputs of separating circuitry 302 and to an input terminal. The feedback amplifier shown in FIG. 4 is characterized in that amplified signal path 303 and feedback signal path 304 are separated from each other by separating circuitry 302.

Amplifying circuitry 310 according to the present embodiment comprises a source-grounded FET under a resistive load, a level-adjusting diode, and a source follower circuit. Separating circuitry 302 comprises source follower circuits that are connected in cascade and have two outputs connected to feedback circuitry 1 (301a) and feedback circuitry 2 (301b). Feedback circuitries 301a, 301b are connected to the input terminal of amplifying circuitry 310 through two feedback signal paths 304.

According to the present embodiment, amplified signal path 303 and feedback signal path 304 are separated from each other by separating circuitry 302. Therefore, the loads imposed respectively on amplified signal path 303 and feedback signal path 304 are smaller than those in the conventional circuit shown in FIG. 1 for achieving wide-band characteristics. A delay time added by separating circuitry 302 is adjusted to match a frequency range, in which negative feedback changes to positive feedback, to a frequency range in which the gain of a negative feedback amplifying section is lowered, thereby further achieving a wider band for the gain.

A voltage variation (the product of feedback resistors 301a/301b and input current 305) due to input current 305 is separated from amplified signal path 303, and distributed by the two feedback resistors. Consequently, a distortion of the output waveform and an operation failure due to a high current input are reduced for a wider dynamic range. Control terminal 308 of separating circuitry 302 serves to change the potential of terminal 309 to vary the voltage variation caused across feedback resistors 301a, 301b by input current 305 and the frequency characteristics in which negative feedback changes to positive feedback.

According to the present embodiment, both the gain and band are improved 5% or more over those of the conventional circuit. With regard to the dynamic range, a maximum allowable input current applied to the circuit according to the present invention is 10% or more greater than that applied to the conventional circuit. The control terminal adjusts the gains and the bands of photodetector elements having different characteristics, providing a receiver circuit having uniform output characteristics.

(3rd Embodiment)

Figure 5:
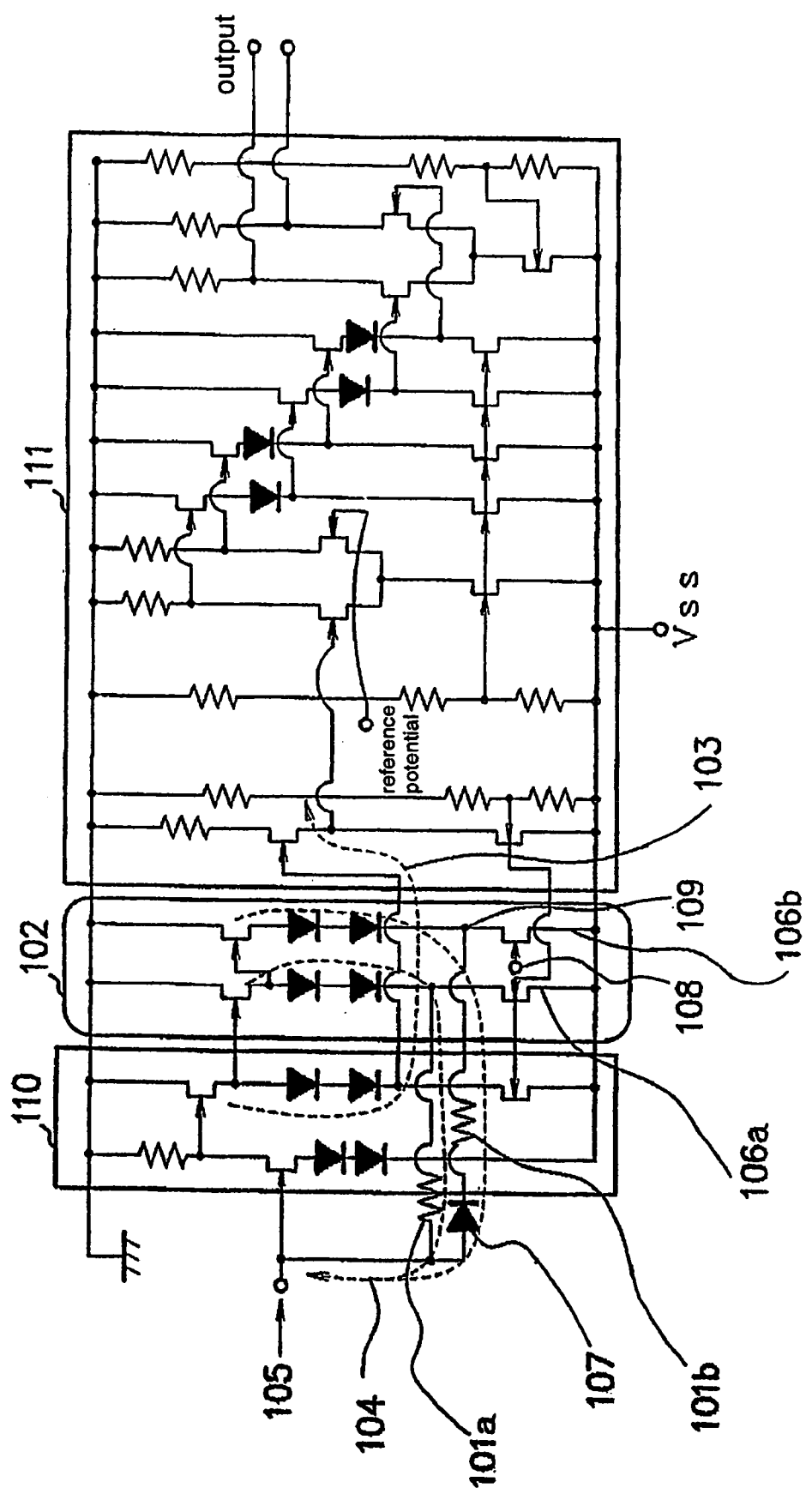
FIG. 5 is a circuit diagram of a circuit according to a third embodiment of the present invention.

FIG. 5 is a circuit diagram of a circuit according to a third embodiment of the present invention, of feedback amplifiers according to first through sixth inventions. The feedback amplifier shown in FIG. 5 comprises amplifying circuitry 110 for amplifying input current 105, separating circuitry 102 and output circuitry 111 which are connected to the output of amplifying circuitry 110, and feedback circuitries 101a, 101b which are connected both to the output of separating circuitry 102 and to an input terminal. The feedback amplifier shown in FIG. 5 is characterized in that amplified signal path 103 and feedback signal path 104 are separated from each other by separating circuitry 102.

Amplifying circuitry 110 according to the present embodiment comprises a source-grounded FET under a resistive load, a level-adjusting diode, and a source follower circuit. Separating circuitry 102 comprises source follower circuits that are connected in cascade and have two outputs connected to feedback circuitry 1 (101a) comprising a resistor and feedback circuitry 2 (107/101b) comprising a diode and a resistor. Feedback circuitries 101a, 101b are connected to the input terminal of amplifying circuitry 110 through two feedback signal paths 104.

According to the present embodiment, amplified signal path 103 and feedback signal path 104 are separated from each other by separating circuitry 102. Therefore, the loads imposed respectively on amplified signal path 103 and feedback signal path 104 are smaller than those in the conventional circuit shown in FIG. 1 for achieving wide-band characteristics. A delay time added by separating circuitry 102 is adjusted to equalize a frequency range in which negative feedback changes to positive feedback to a frequency range in which the gain of a negative feedback amplifying section is lowered, thereby further achieving a wider band for the gain. Furthermore, a voltage variation (the product of feedback resistor 101a and input current 105) due to input current 105 is separated from amplified signal path 103. Consequently, a distortion of the output waveform and an operation failure due to a high current input are reduced for a wider dynamic range.

In addition, an operational margin against an increase in the input current is realized since feedback quantities are automatically switched depending on a gain due primarily to feedback resistor 101a in a turn-off region of diode 107, or on a gain due primarily to feedback resistors 101a and 101b and the amount of input current in a turn-on region of diode 107. Control terminal 108 of separating circuitry 102 serves to change the potential of terminal 109 to adjust input current 105 for turning on diode 107 of feedback circuitry 2.

Figure 1:
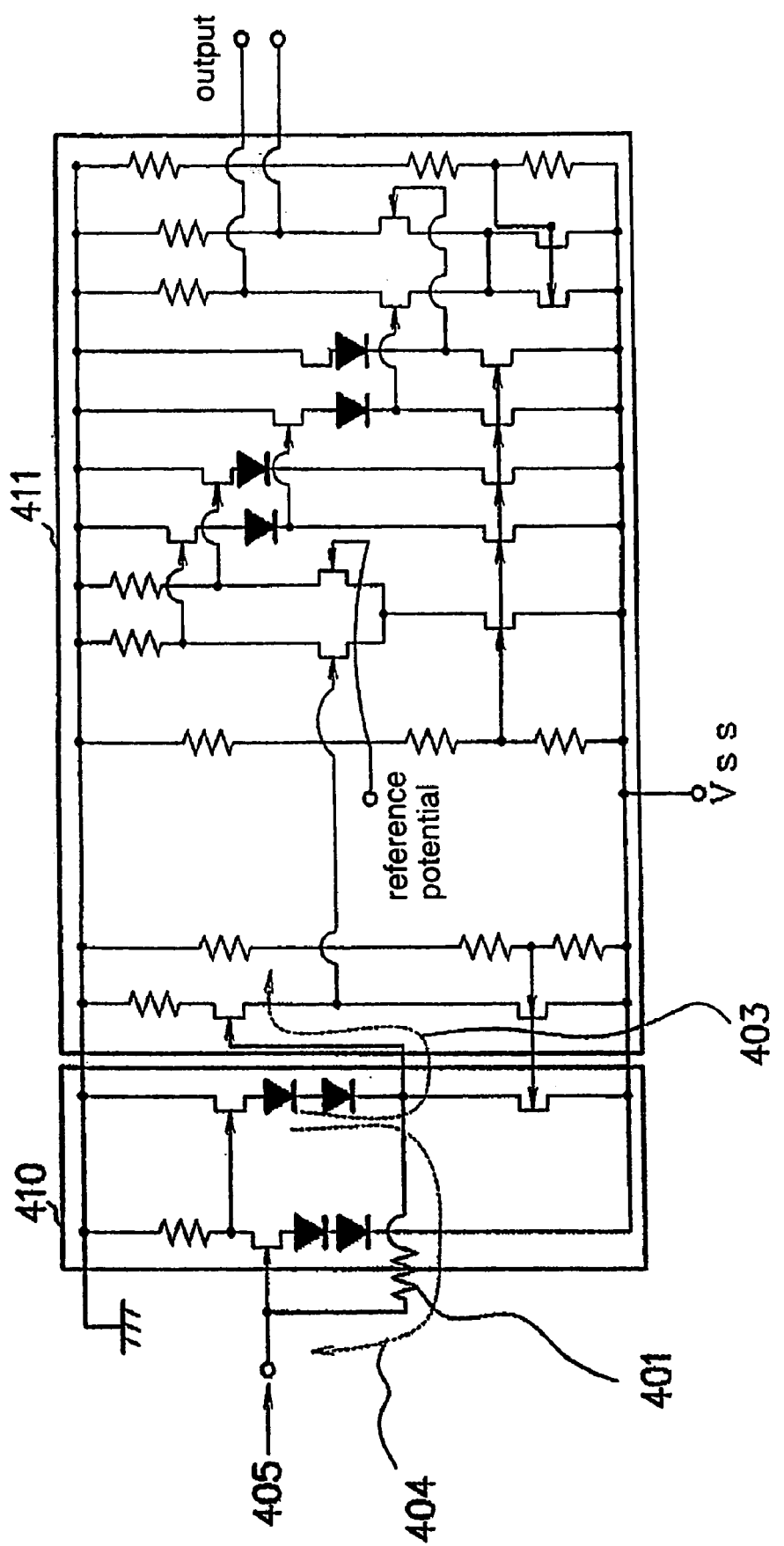
FIG. 1 is a circuit diagram of a conventional current-feedback amplifier.
Figure 6:
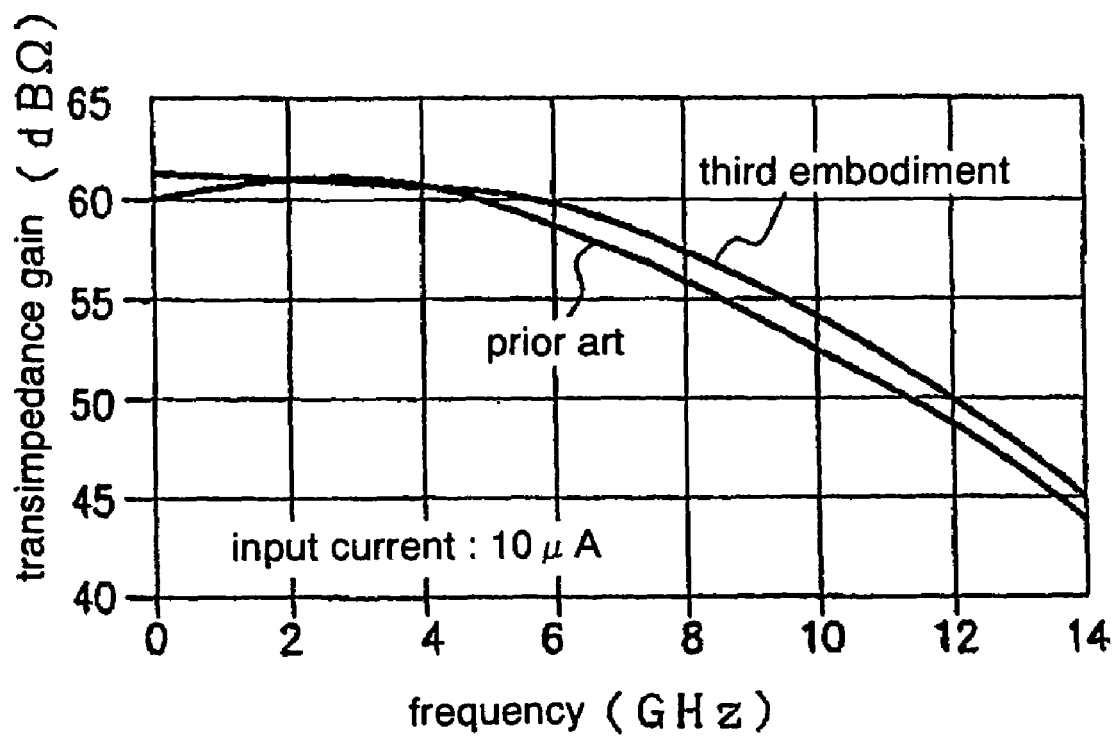
FIG. 6 is a diagram showing the frequency characteristics of gains of the circuit according to the third embodiment and the conventional circuit (input current: 10 µA)
Figure 7:
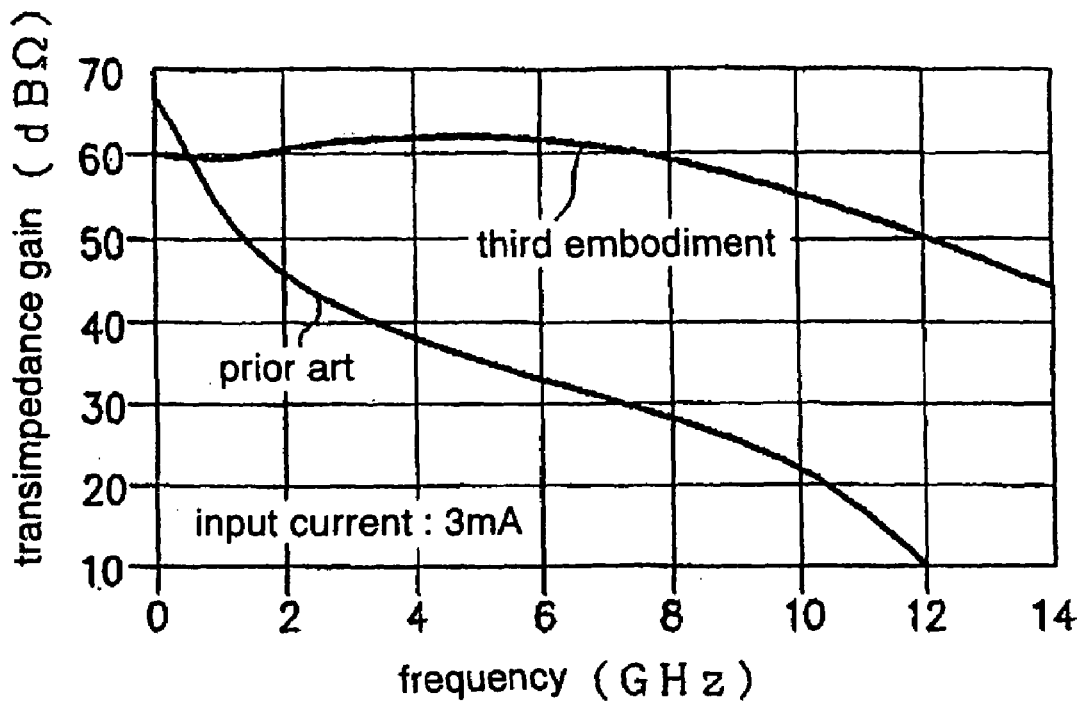
FIG. 7 is a diagram showing the frequency characteristics of gains of the circuit according to the third embodiment and the conventional circuit (input current: 3 mA)
Figure 8:
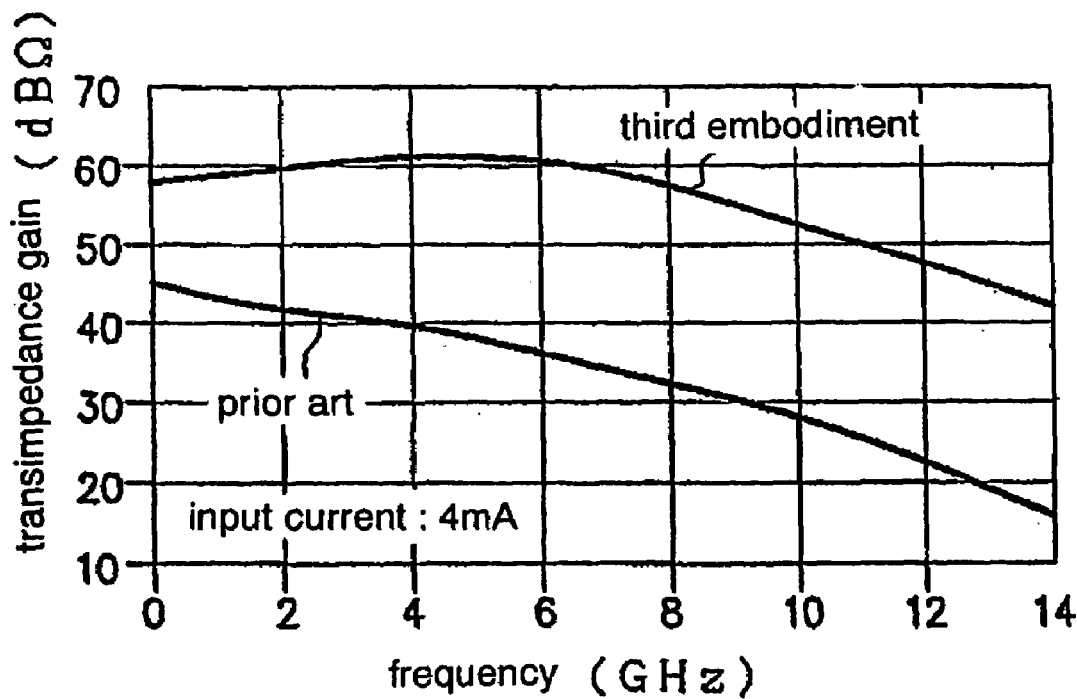
FIG. 8 is a diagram showing the frequency characteristics of gains of the circuit according to the third embodiment and the conventional circuit (input current: 4 mA)

FIG. 6 shows, for comparison, the frequency characteristics of gains of the circuit according to the present embodiment and the conventional circuit shown in FIG. 1, with input capacitance 280 fF and input resistance 20 Ω added as a photodiode model to those circuits. FIGS. 7 and 8 show, for comparison, the frequency characteristics of gains of the circuit according to the present embodiment and the conventional circuit shown in FIG. 1, with the above photodiode model added to those circuits, the frequency characteristics being plotted when 3 mA and 4 mA of input current 105 were supplied.

As can be seen from FIG. 6, the gain at lower frequencies and the flatness at those frequencies according to the present embodiment are improved over those of the conventional circuit, and the band according to the present embodiment is 10% or more greater than that of the conventional circuit. As can be seen from FIGS. 7 and 8, even when the input current is 3 mA and 4 mA, the frequency characteristics of gains are essentially not deteriorated, and a very wide dynamic range is realized. Furthermore, control terminal 108 may be used to control the potential of terminal 109 for adjusting an input current to turn on the diode, and the gain and the band depending on the photodetector elements, providing a receiver circuit system having uniform output characteristics.

(4th Embodiment)

Figure 9:
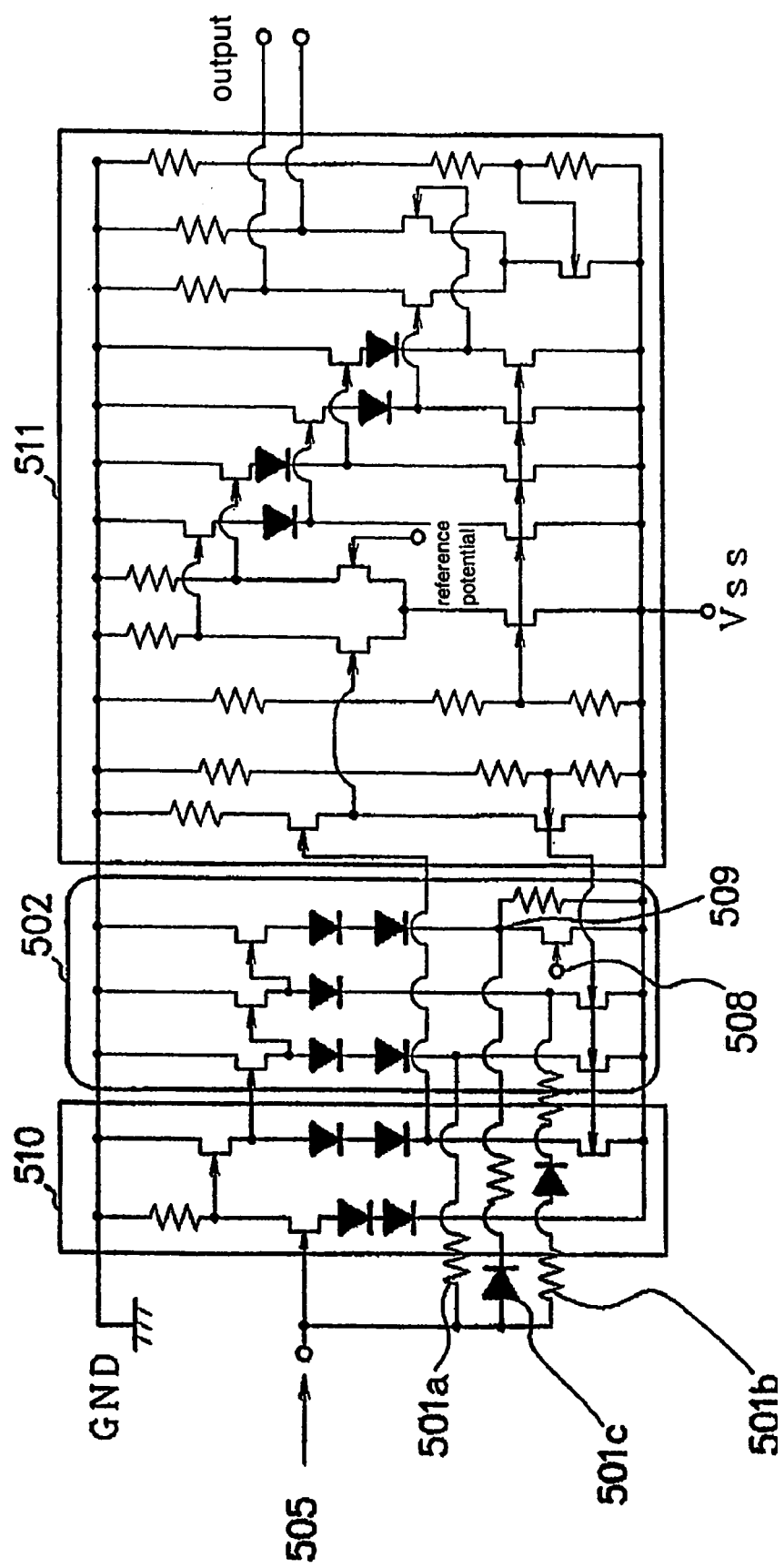
FIG. 9 is a circuit diagram of a circuit according to a fourth embodiment of the present invention.

FIG. 9 is a circuit diagram of a circuit according to a fourth embodiment of the present invention, of feedback amplifiers according to first through sixth inventions. The feedback amplifier shown in FIG. 9 comprises amplifying circuitry 510 for amplifying input current 505, separating circuitry 502 and output circuitry 511 which are connected to the output of amplifying circuitry 510, and feedback circuitries 501a, 501b, 501c which are connected both to the outputs of separating circuitry 502 and to an input terminal. The feedback amplifier shown in FIG. 9 is characterized in that the amplified signal path and the feedback signal path are separated from each other by separating circuitry 502.

Amplifying circuitry 510 according to the present embodiment comprises a source-grounded FET under a resistive load, a level-adjusting diode, and a source follower circuit. Separating circuitry 502 comprises source follower circuits that are connected in cascade and have three outputs connected to feedback circuitry 1 (501*a*) comprising a resistor and feedback circuitry 2 (501*b*) and feedback circuitry 3 (501*c*) which comprise a diode and a resistor. Feedback circuitries 501*a*, 501*b*, 501*c* are connected to the input terminal of amplifying circuitry 510 through three feedback signal paths.

According to the present embodiment, the amplified signal path and the feedback signal path are separated from each other by separating circuitry 502. Therefore, the loads imposed respectively on the amplified signal path and the feedback signal path are smaller than those in the conventional circuit shown in FIG. 1 for achieving wide-band characteristics. A delay time added by separating circuitry 502 is adjusted to match a frequency range, in which negative feedback changes to positive feedback, to a frequency range in which the gain of a negative feedback amplifying section is lowered, thereby further achieving a wider band for the gain. A voltage variation (the product of the feedback resistor and input current 505) due to input current 505 is separated from amplified signal path 503. Consequently, a distortion of the output waveform and an operation failure due to a high current input are reduced for a wider dynamic range.

Furthermore, the turn-off and the turn-on of the diodes of feedback circuitries 501*b*, 501*c* are automatically switched depending on the amount of input current, and the feedback quantities produced by feedback circuitries 501*a*, 501*b*, 501*c* are automatically changed. Control terminal 508 of separating circuitry 502 serves to change the potential of terminal 509 to finely adjust the amount of input current 505 to turn on the diode of feedback circuitry 3 (501*c*). With this arrangement, there are realized characteristics for providing an operational margin against an increase in the input current, and the gain/band characteristics and the maximum allowable input current can be controlled by control terminal 508.

Figure 10:
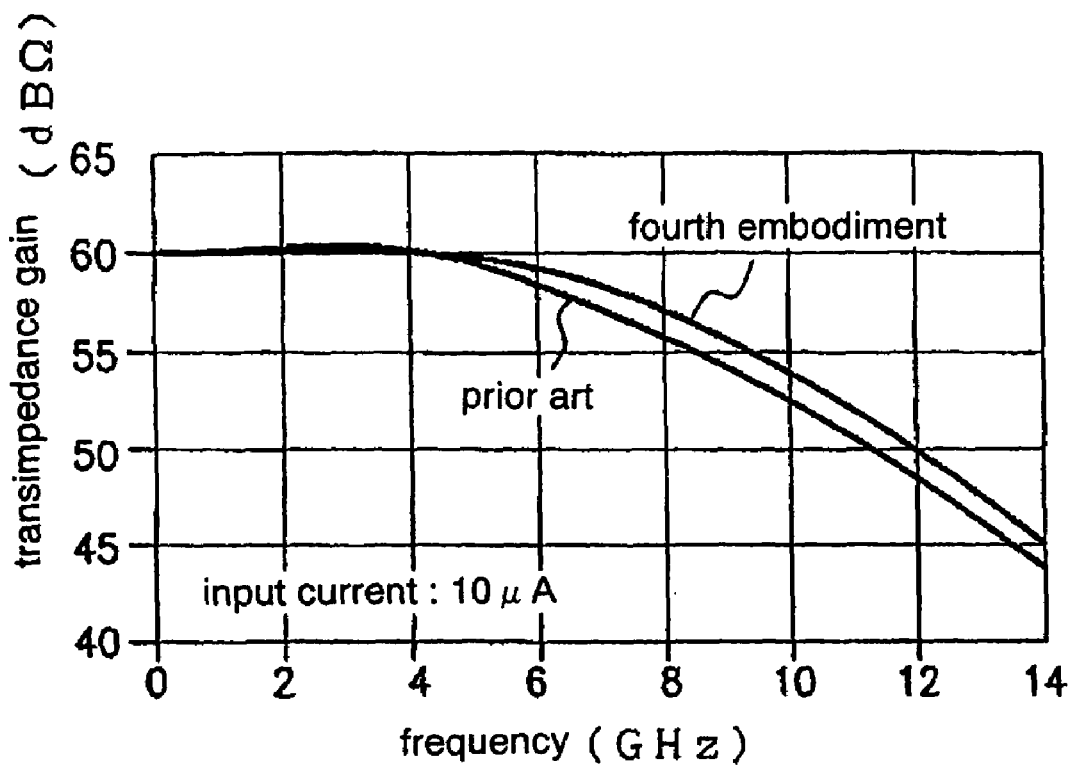
FIG. 10 is a diagram showing the frequency characteristics of gains of the circuit according to the fourth embodiment and the conventional circuit (input current: 10 µA)
Figure 11:
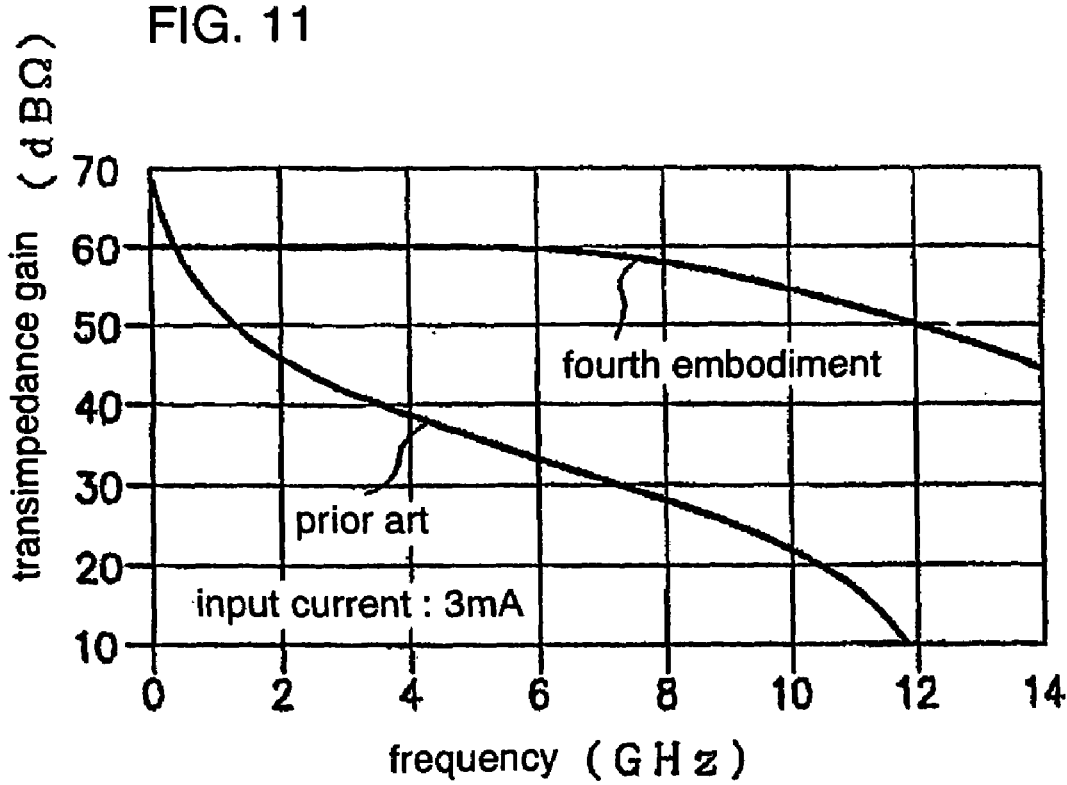
FIG. 11 is a diagram showing the frequency characteristics of gains of the circuit according to the fourth embodiment and the conventional circuit (input current: 3 mA)
Figure 12:
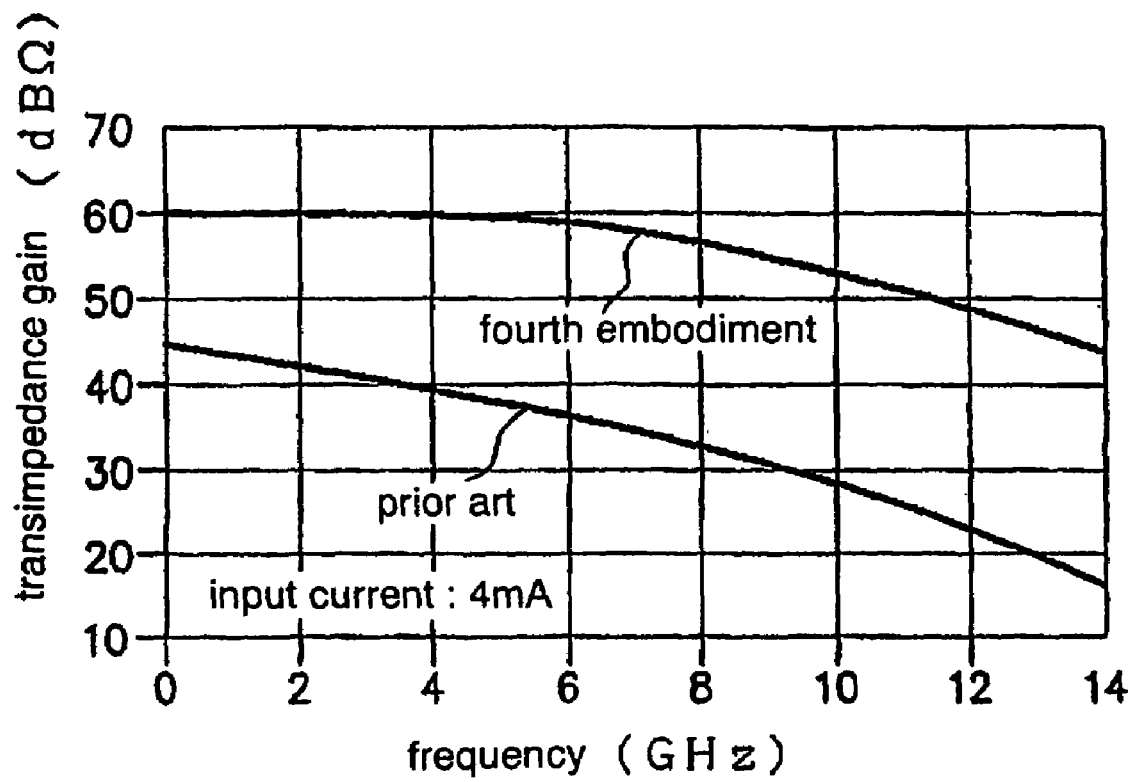
FIG. 12 is a diagram showing the frequency characteristics of gains of the circuit according to the fourth embodiment and the conventional circuit (input current: 4 mA).

FIG. 10 shows, for comparison, the frequency characteristics of gains of the circuit according to the present embodiment and the conventional circuit shown in FIG. 1, with input capacitance 270 fF and input resistance 30 Ω added as a photodiode model to those circuits. FIGS. 11 and 12 show, for comparison, the frequency characteristics of gains of the circuit according to the present embodiment and the conventional circuit shown in FIG. 1, with the above photodiode model added to those circuits, the frequency characteristics being plotted when 3 mA and 4 mA of input current 505 were supplied.

As can be seen from FIG. 10, the band according to the present embodiment is 5% or more greater than that of the conventional circuit. As can be seen from FIGS. 11 and 12, even when the input current is 3 mA and 4 mA, the frequency characteristics of gains are essentially not deteriorated, and a very wide dynamic range is realized. Furthermore, control terminal 508 may be used to control the potential of terminal 509 for adjusting an input current to turn on the diode, and the gain and the band in a wider range depending on the photodetector elements, providing a receiver circuit system having uniform output characteristics.

In the first through fourth embodiments, the circuit is illustrated as employing a field-effect transistor (FET). However, the circuit elements used in the feedback amplifier according to the present invention may be a bipolar transistor, a heterojunction bipolar transistor, or a MOS transistor.

In the first through fourth embodiments, the separating circuitry is illustrated as having a source follower circuit. However, the separating circuitry may be a combination of plural sets each including a source follower and an amplifier comprising a load and a transistor.

The first through fourth embodiments are examples of preferred embodiments of the present invention. The present invention is not limited to those embodiments, but various changes and modifications may be made without departing from the scope of the present invention.

The invention claimed is:

1. A feedback amplifier comprising:
   an amplifying circuitry including a transistor and a resistive element for amplifying a signal input from an input terminal and outputting an amplified signal:
   a feedback circuitry having an output terminal connected to an input terminal of said amplifying circuitry;
   a signal separating circuitry having an input terminal connected to an output terminal of said amplifying circuitry and an output terminal connected to an input terminal of said feedback circuitry;
   an output circuitry having an input terminal connected to the output terminal of said amplifying circuitry; and
   a level adjusting circuit for outputting a signal amplified by a transistor to a next stage, said level adjusting circuit having an output terminal connected both to input terminals of said signal separating circuitry and to said output circuitry,
   wherein the input terminal of said amplifying circuitry is supplied by way of feedback with only a signal which has passed through said signal separating circuitry and said feedback circuitry.

2. A feedback amplifier according to claim 1, wherein said signal separating circuitry includes at least one transistor circuit.

3. A feedback amplifier according to claim 2, wherein said transistor circuit separates an output signal output from said amplifying circuitry to said output circuitry, and a feedback signal supplied by way of feedback from said amplifying circuitry through said signal separating circuitry and said feedback circuitry to said amplifying circuitry.

4. A feedback amplifier according to claim 2 or 3, wherein said transistor circuit comprises a source follower circuit.

5. A feedback amplifier according to any one of claims 2, 3 and 1, for use as a current-feedback amplifier.

6. A feedback amplifier comprising:
   an amplifying circuitry including a transistor and a resistive element for amplifying a signal input from an input terminal and outputting an amplified signal;
   a feedback circuitry having an output terminal connected to an input terminal of said amplifying circuitry;
   a signal separating circuitry having an input terminal connected to an output terminal of said amplifying circuitry and an output terminal connected to an input terminal of said feedback circuitry, wherein said signal separating circuit further includes a level shifting circuit, said level shifting circuit having an output terminal connected to the input terminal of said feedback circuitry; and an output circuitry having an input terminal connected to the output terminal of said amplifying circuitry;

wherein the input terminal of said amplifying circuitry is supplied by way of feedback with only a signal which has passed through said signal separating circuitry and said feedback circuitry.

7. A feedback amplifier according to claim 5 or 6, wherein said signal separating circuitry is of a multistage arrangement having a level shifting circuit or a unit including a transistor, a resistive element, and a level shifting circuit.

8. A feedback amplifier according to claim 7, wherein said signal separating circuitry is of a two-stage arrangement, and there are at least two of said feedback circuitry corresponding thereto.

9. A feedback amplifier according to claim 8, wherein a diode is inserted in at least one of feedback circuitries.

10. A feedback amplifier according to any one of claims 2, 3, 1 and 6, wherein said signal separating circuitry further has a control terminal for controlling a feedback signal.

11. A feedback amplifier according to claim 6, for use as a current-feedback amplifier.

* * * * *